United States Patent
Fujita et al.

(10) Patent No.: US 9,530,561 B2
(45) Date of Patent: Dec. 27, 2016

(54) MONOLITHIC CERAMIC CAPACITOR, MONOLITHIC CERAMIC CAPACITOR ARRAY, AND MONOLITHIC CERAMIC CAPACITOR MOUNTING STRUCTURE

(71) Applicant: Murata Manufacturing Co., Ltd., Nagaokakyo-shi, Kyoto-fu (JP)

(72) Inventors: Yukihiro Fujita, Nagaokakyo (JP); Tadateru Yamada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 130 days.

(21) Appl. No.: 14/616,787

(22) Filed: Feb. 9, 2015

(65) Prior Publication Data

US 2015/0228409 A1 Aug. 13, 2015

(30) Foreign Application Priority Data

Feb. 10, 2014 (JP) .................. 2014-023457

(51) Int. Cl.
*H01G 4/30* (2006.01)
*H01G 4/012* (2006.01)
*H01G 4/12* (2006.01)

(52) U.S. Cl.
CPC ............... *H01G 4/012* (2013.01); *H01G 4/12* (2013.01); *H01G 4/30* (2013.01); *H01G 4/129* (2013.01)

(58) Field of Classification Search
CPC ............. H01G 4/30; H01G 4/005; H01G 4/06
See application file for complete search history.

(56) References Cited

U.S. PATENT DOCUMENTS

| 4,347,650 | A | † | 9/1982 | McLarney |
| 5,072,329 | A | † | 12/1991 | Galvagni |
| 5,548,474 | A | † | 8/1996 | Chen |
| 6,377,439 | B1 | * | 4/2002 | Sekidou ............... H01G 4/005 361/303 |

(Continued)

FOREIGN PATENT DOCUMENTS

| JP | 2002-299193 A | 10/2002 |
| JP | 2006-41268 A | 2/2006 |

(Continued)

OTHER PUBLICATIONS

Official Communication issued in corresponding Japanese Patent Application No. 2014-023457, mailed on Dec. 22, 2015.

*Primary Examiner* — Dion R Ferguson
(74) *Attorney, Agent, or Firm* — Keating & Bennett, LLP

(57) ABSTRACT

A monolithic ceramic capacitor includes a plurality of first and second inner electrodes in a ceramic body. A direction in which the first and second inner electrodes are stacked is a stacking direction, a direction perpendicular or substantially perpendicular to the stacking direction in the ceramic body is a length direction, and a direction perpendicular or substantially perpendicular to the stacking direction and the first direction is a width direction. The ceramic body includes an effective portion, a first outer layer portion, a second outer layer portion, a first side portion, and a second side portion. A ratio A/B is about 0.04 or less when a dimension of each of the first side portion and the second side portion in the width direction is A and a dimension of the effective portion in the stacking direction is B.

19 Claims, 4 Drawing Sheets

(56) References Cited

U.S. PATENT DOCUMENTS

| | | | |
|---|---|---|---|
| 9,093,220 B1 * | 7/2015 | Kitano | H01G 4/12 |
| 9,099,246 B1 * | 8/2015 | Kitano | H01G 4/1227 |
| 2012/0073129 A1 | 3/2012 | Abe et al. | |
| 2012/0250220 A1 * | 10/2012 | Yamashita | H01G 4/005 |
| | | | 361/321.2 |
| 2012/0300361 A1 | 11/2012 | Togashi | |
| 2013/0056252 A1 | 3/2013 | Fujii et al. | |
| 2014/0166351 A1 * | 6/2014 | Lee | H01G 2/06 |
| | | | 174/258 |
| 2014/0301013 A1 * | 10/2014 | Kim | H01G 4/012 |
| | | | 361/301.4 |
| 2015/0200054 A1 * | 7/2015 | Lee | H01G 4/12 |
| | | | 174/258 |

FOREIGN PATENT DOCUMENTS

| | | |
|---|---|---|
| JP | 2009-32833 A | 2/2009 |
| JP | 2012-94819 A | 5/2012 |
| JP | 2012-248581 A | 12/2012 |
| JP | 2013-065820 A | 4/2013 |

\* cited by examiner
† cited by third party

MONOLITHIC CERAMIC CAPACITOR, MONOLITHIC CERAMIC CAPACITOR ARRAY, AND MONOLITHIC CERAMIC CAPACITOR MOUNTING STRUCTURE

BACKGROUND OF THE INVENTION

1. Field of the Invention

The present invention relates to a monolithic ceramic capacitor, a monolithic ceramic capacitor array, and a monolithic ceramic capacitor mounting structure.

2. Description of the Related Art

Japanese Unexamined Patent Application Publication No. 2013-65820 discloses a monolithic ceramic capacitor mounting structure. According to Japanese Unexamined Patent Application Publication No. 2013-65820, in a ceramic body of a monolithic ceramic capacitor, a ceramic layer that is situated below a portion where a plurality of inner electrodes are stacked and opposed to each other via a dielectric layer interposed therebetween is thicker than this portion. It is believed that this reduces what is called "acoustic noise" when the monolithic ceramic capacitor is mounted on a circuit board.

When a voltage that is applied to the monolithic ceramic capacitor varies, the ceramic body may become distorted. This distortion is propagated to the circuit board on which the monolithic ceramic capacitor is mounted with, for example, a conductive bonding material. This causes the circuit board to vibrate. The result of the vibration is that the acoustic noise occurs.

In Japanese Unexamined Patent Application Publication No. 2013-65820, although the acoustic noise is reduced, it may still not be sufficiently reduced.

SUMMARY OF THE INVENTION

Accordingly, preferred embodiments of the present invention provide a monolithic ceramic capacitor, a monolithic ceramic capacitor array, and a monolithic ceramic capacitor mounting structure, which even more effectively reduces or prevents acoustic noise.

According to a preferred embodiment of the present invention, a monolithic ceramic capacitor includes a ceramic body made of a dielectric material, and a plurality of inner electrodes that are stacked so as to oppose each other with a dielectric layer being interposed between adjacent ones of the inner electrodes in the ceramic body. In the ceramic body, a direction in which the plurality of inner electrodes are stacked is a stacking direction, a first direction that is perpendicular or substantially perpendicular to the stacking direction is a length direction, and a second direction that is perpendicular or substantially perpendicular to the stacking direction and to the first direction is a width direction. The ceramic body includes an effective portion, a first outer layer section, a second outer layer section, a first-width-direction gap portion, and a second-width-direction gap portion. The effective portion includes the plurality of inner electrodes that are stacked. The first outer layer section is positioned at one side of the effective portion in the stacking direction. The second outer layer section is positioned at the other side of the effective portion in the stacking direction. The first-width-direction gap portion is provided at one side in the width direction of a portion where the effective portion and the first and second outer layer sections are stacked. The second-width-direction gap portion is provided at the other side in the width direction of the portion where the effective portion and the first and second outer layer sections are stacked. In the monolithic ceramic capacitor, A/B preferably is about 0.04 or less, for example, where a dimension of each of the first-width-direction gap portion and the second-width-direction gap portion in the width direction is A and a thickness of the effective portion is B, the thickness of the effective portion being a dimension of the effective portion in the stacking direction.

In the above-described monolithic ceramic capacitor, it is preferable that an outer-side surface of the first outer layer section in the stacking direction be a mounting surface side, and that, when a thickness of the first outer layer section is C, C>A.

In the above-described monolithic ceramic capacitor, it is preferable that an outer-side surface of the first outer layer section in the stacking direction be a mounting surface side, and that, when a thickness of the first outer layer section is C and a thickness of the second outer layer section is D, C>D.

In the above-described monolithic ceramic capacitor, it is preferable that an outer-side surface of the first outer layer section in the stacking direction be a mounting surface side, and that, when a thickness of the first outer layer section is C and a thickness of the second outer layer section is D, C>D>A.

In the above-described monolithic ceramic capacitor, it is preferable that the dimension A of each of the first-width-direction gap portion and the second-width-direction gap portion in the width direction is about 17 µm or less, for example.

In the above-described monolithic ceramic capacitor, it is preferable that a density of each of the first-width-direction gap portion and the second-width-direction gap portion be less than a density of the dielectric layer of the effective portion.

In the above-described monolithic ceramic capacitor, the ceramic body may contain dielectric ceramic and glass, and a glass content ratio of each of the width-direction gap portions may be less than a glass content ratio of the dielectric layer of the effective portion.

In the above-described monolithic ceramic capacitor, the ceramic body may include a void, and a void ratio of each of the width-direction gap portions may be less than a void ratio of the dielectric layer of the effective portion.

In the above-described monolithic ceramic capacitor, it is preferable that A/B be about 0.03 or less, for example.

According to another preferred embodiment of the present invention, a monolithic ceramic capacitor array includes a packing member including a plurality of cavities, and monolithic ceramic capacitors that are configured in accordance with preferred embodiments of the present invention and that are accommodated in the respective cavities. In the monolithic ceramic capacitor array, the inner electrodes of each monolithic ceramic capacitor are disposed parallel or substantially parallel to a bottom surface of the corresponding cavity.

According to a further preferred embodiment of the present invention, a monolithic ceramic capacitor mounting structure includes a board and a monolithic ceramic capacitor that is configured in accordance with preferred embodiments of the present invention and that is mounted on a surface of the board. In the monolithic ceramic capacitor mounting structure, the stacking direction is perpendicular or substantially perpendicular to the surface of the board, and the first outer layer section is positioned closer to the board than the second outer layer section.

According to the monolithic ceramic capacitors according to various preferred embodiments, since A/B preferably is about 0.04 or less, for example, it is possible to even more effectively reduce acoustic noise.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is hereunder made explicit by describing specific preferred embodiments of the present invention with reference to the drawings.

Figure 1A:
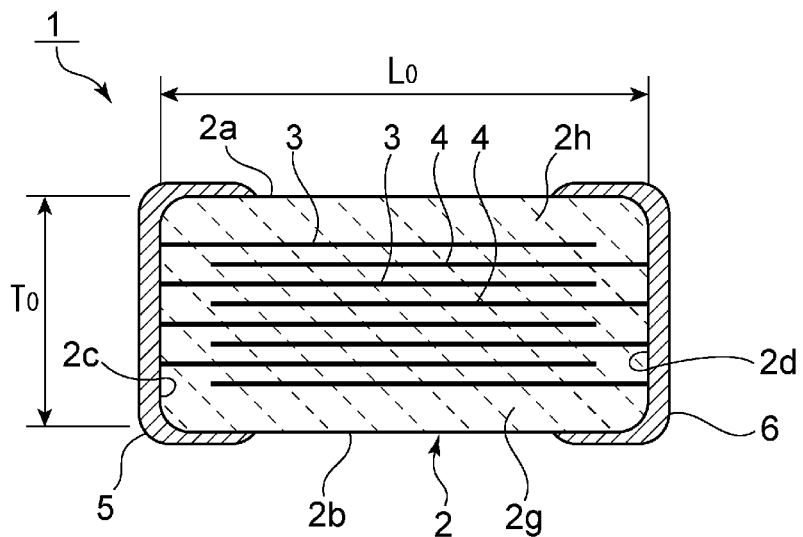
FIGS. 1A and 1B are, respectively, a front sectional view and a side sectional view of a monolithic ceramic capacitor according to a first preferred embodiment of the present invention.
Figure 1B:
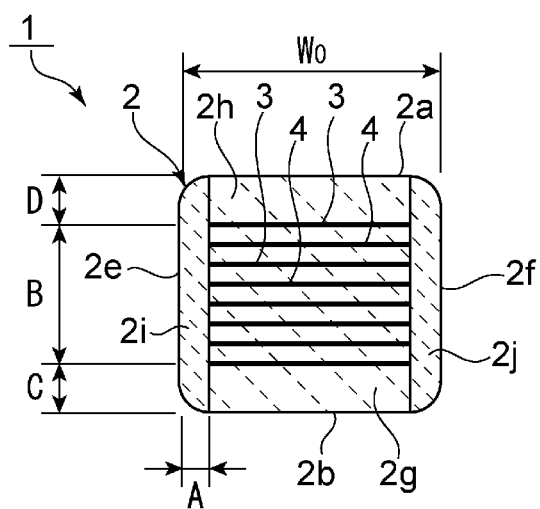

FIGS. 1A and 1B are, respectively, a front sectional view and a side sectional view of a monolithic ceramic capacitor 1 according to a first preferred embodiment of the present invention.

The monolithic ceramic capacitor 1 includes a rectangular or substantially rectangular parallelepiped ceramic body 2. The ceramic body 2 is preferably made of dielectric ceramic. A plurality of first inner electrodes 3 and a plurality of second inner electrodes 4 are provided in the ceramic body 2. The first inner electrodes 3 and the second inner electrodes 4 are alternately stacked so as to oppose each other via a dielectric layer interposed therebetween.

The ceramic body 2 includes a top surface 2a and a bottom surface 2b. A first end surface 2c and a second end surface 2d oppose each other. The ceramic body 2 includes a first side surface 2e and a second side surface 2f. A direction in which the plurality of inner electrodes 3 and 4 are stacked and in which the top surface 2a and the bottom surface 2b are connected to each other corresponds to a stacking direction. A direction that is perpendicular or substantially perpendicular to the stacking direction, that is, a direction in which the first end surface 2c and the second end surface 2d are connected to each other corresponds to a length direction. A direction in which the first side surface 2e and the second side surface 2f are connected to each other corresponds to a width direction. That is, a width direction is perpendicular or substantially perpendicular to the stacking direction and to the length direction.

The ceramic body 2 is preferably made of an appropriate dielectric ceramic. Non-limiting examples of the dielectric ceramic include $BaTiO_3$ based ceramic, $CaTiO_3$ based ceramic, and $SrTio_3$ based ceramic. The plurality of inner electrodes 3 and 4 are preferably made of an appropriate metal or alloy, such as Ni, Cu, Ag, or an Ag—Pd alloy.

In the ceramic body 2, a portion where the plurality of first inner electrodes 3 and the plurality of second inner electrodes 4 are stacked via a dielectric layer interposed therebetween is an effective portion. In addition, a portion of a dielectric layer that is positioned at one side, that is, the bottom side in FIGS. 1A and 1B, of this effective portion in the stacking direction is a first outer layer portion 2g. A portion of a dielectric layer that is positioned at the opposite side, that is, the top side in FIGS. 1A and 1B, of this effective portion in the stacking direction is a second outer layer portion 2h. In other words, the first and second outer layer portions 2g and 2h sandwiches the effective portion in the stacking direction.

As shown in FIG. 1B, a dimension of the first outer layer portion 2g in the width direction and a dimension of the second outer layer portion 2h in the width direction are equal or substantially equal to dimensions of the first inner electrodes 3 in the width direction and dimensions of the second inner electrodes 4 in the width direction.

The ceramic body 2 includes a first side portion 2i at the first side surface 2e of the effective portion and a second side portion 2j at the second side surface 2f of the effective portion. The first and second side portions 2i and 2j not only cover side surfaces of the effective portion where the first inner electrodes 3 and the second inner electrodes 4 are exposed at the effective portion, but also cover side surfaces of the first and second outer layer portions 2g and 2h. That is, the first and second side portions 2i and 2j respectively include the first and second side surfaces 2e and 2f. In other words, the first and second side portions 2i and 2j sandwich the effective portion in the width direction.

As shown in FIG. 1A, a first outer electrode 5 and a second outer electrode 6 cover the first end surface 2c and the second end surface 2d, respectively. The first outer electrode 5 and the second outer electrode 6 can be formed by, for example, baking a conductive paste and/or plating. The first outer electrode 5 is electrically connected to the first inner electrodes 3. The second outer electrode 6 is electrically connected to the second inner electrodes 4.

The first outer electrode 5 and the second outer electrode 6 preferably are made of an appropriate metal, such as Ni, Ag, Cu, or Sn, or an appropriate alloy thereof.

In producing the ceramic body 2, mother inner electrodes are formed on ceramic green sheets principally including dielectric layers. The ceramic green sheets on which the mother inner electrodes are formed are stacked, and mother ceramic green sheets without patterns are placed on the top and bottom of the stack of ceramic green sheets. A mother multilayer body formed in this way is cut, to form a structure in which the first outer layer section 2g is located at a lower side of the effective portion and the second outer layer section 2h is located at an upper side of the effective portion. Then, by applying ceramic slurry to the side surfaces of this structure, or by attaching ceramic green sheets to the side surfaces of this structure, the first side portion 2i and the second side portion 2j are formed. By firing such a multilayer body formed in this way, the ceramic body 2 is formed.

In the monolithic ceramic capacitor 1, the first and second side portions 2i and 2j are formed by performing the above process. Therefore, a dimension A of each of the first and second side portions 2i and 2j in the width direction, that is, the thickness of each of the first and second side portions 2i and 2j is small. Therefore, it is possible to reduce size and increase capacity.

In addition, in the monolithic ceramic capacitor 1 according to the present preferred embodiment, when the dimension of each of the first and second side portion 2i and 2j in the width direction is A, and a dimension of the effective portion along the stacking direction is B, a ratio A/B preferably is about 0.04 or less, for example. By this, even if a voltage is applied to the monolithic ceramic capacitor 1 after it has been mounted on, for example, a mount board, it is even less likely for the acoustic noise to occur. This is described in detail with reference to FIGS. 2 to 5.

In the monolithic ceramic capacitor 1 according to the present preferred embodiment, the first outer layer portion 2g is the side that is mounted on the mount board. That is, the monolithic ceramic capacitor 1 is mounted on the mount board from the bottom surface 2b. The bottom surface 2b of the first outer layer portion 2g is a mounting surface.

Figure 5:
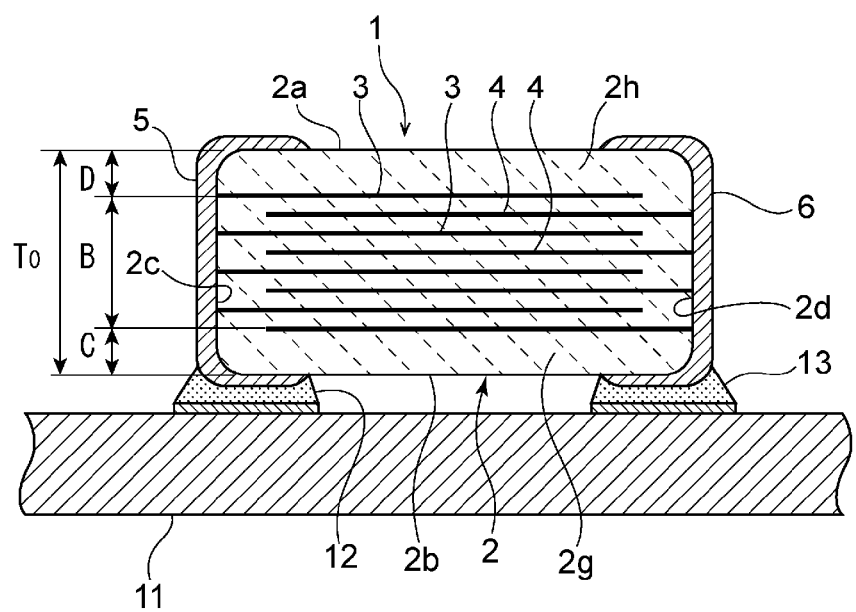
FIG. 5 is a partial cutaway front sectional view of a mounting structure in which the monolithic ceramic capacitor according to the first preferred embodiment is mounted on a circuit board.

FIG. 5 is a partial cutaway front sectional view of a monolithic ceramic capacitor mounting structure in which the monolithic ceramic capacitor 1 is mounted on a circuit board 11. The monolithic ceramic capacitor 1 is mounted on the mount board 11 from the bottom surface 2b. Here, the stacking direction in the monolithic ceramic capacitor 1 is perpendicular or substantially perpendicular to a surface of the mount board 11. Since the monolithic ceramic capacitor 1 is mounted from the bottom surface 2b, the first outer layer section 2g is positioned closer to the mount board 11 than the second outer layer section 2h. More specifically, the first outer electrode 5 and the second outer electrode 6 are bonded and fixed to electrodes on the mount board 11 using a first bonding material 12 and a second bonding material 13, respectively.

When, in this state, a voltage is applied to the monolithic ceramic capacitor 1, the ceramic body 2 may become distorted along the stacking direction. More specifically, as shown in the schematic perspective view of FIG. 2, as indicated by an arrow AT and an arrow –AT, a central region of the top surface and a central region of the bottom surface of the ceramic body 2 are distorted upward and downward by a large amount. This is because the effective portion is distorted by the application of a voltage thereto. This causes the ceramic body 2 to become distorted so that a central portion of the first end surface 2c and a central portion of the second end surface 2d approach each other in length directions L. In other words, the first end surface 2c is displaced in the direction of arrow AL, and the center of the second end surface 2d is displaced in the direction of arrow –AL.

In width directions W, the first side surface 2e and the second side surface 2f of the ceramic body 2 are displaced in the direction of arrow AW and the direction of arrow –AW, respectively. The corners of the rectangular or substantially rectangular parallelepiped ceramic body 2 are hardly distorted.

In accordance with the period of the voltage that is applied to the monolithic ceramic capacitor 1, the distortion repeatedly occurs. Therefore, the monolithic ceramic capacitor that is bonded to the mount board 11 using the bonding materials 12 and 13 becomes a vibration source, and the vibration propagates to the mount board 11. This causes the mount board 11 to vibrate, and acoustic noise occurs from the mount board 11.

Figure 2:
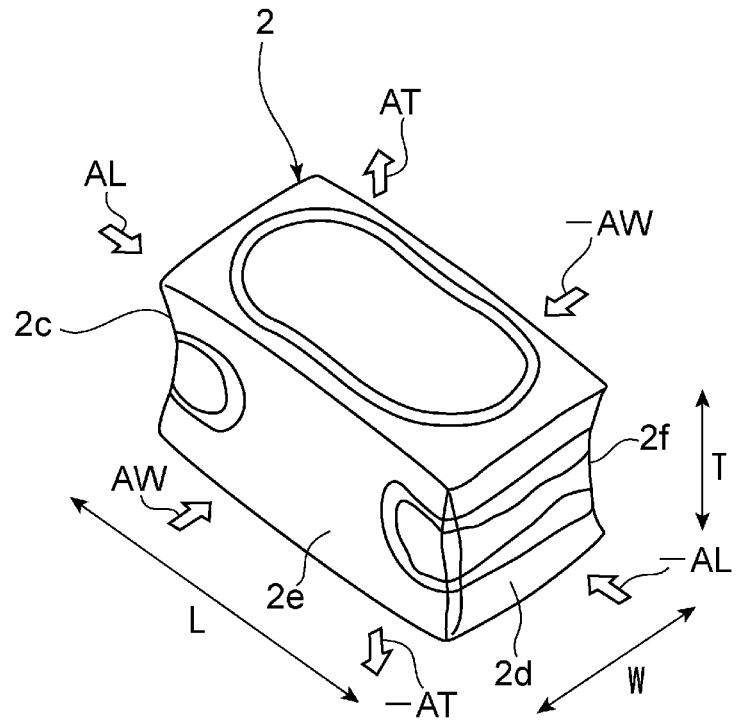
FIG. 2 is a schematic perspective view of a monolithic ceramic capacitor for describing the phenomenon of distortion when a voltage is applied to the monolithic ceramic capacitor.

In the monolithic ceramic capacitor 1 according to the present preferred embodiment, when the effective portion is vertically displaced, that is, when the effective portion is displaced in the direction of arrow AT and the direction of arrow –AT in FIG. 2, the first side portion 2i and the second side portion 2j are pulled by the effective portion and are vertically stretched at central regions thereof. Therefore, when the central regions are vertically stretched, the first side portion 2i and the second side portion 2j contract in the width directions W.

Figure 3:
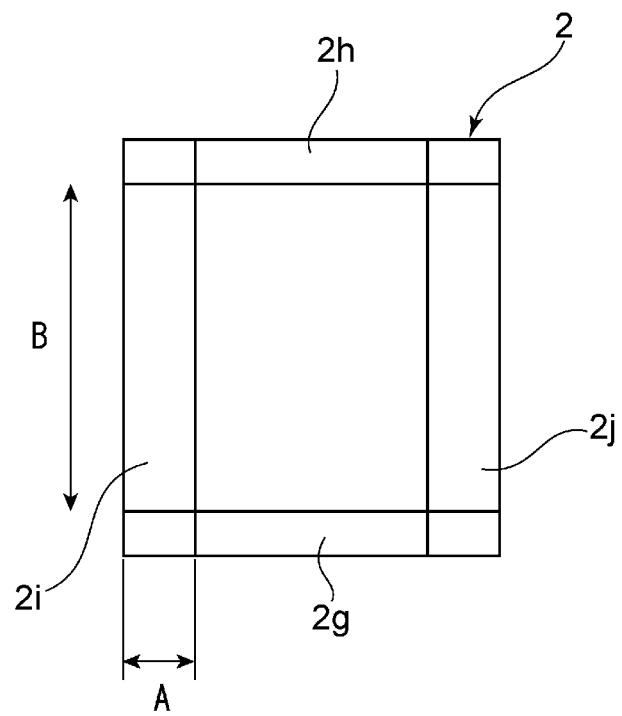
FIG. 3 is a schematic plan view of a monolithic ceramic capacitor for describing a mechanism in which distortion occurs in the monolithic ceramic capacitor.
Figure 4:
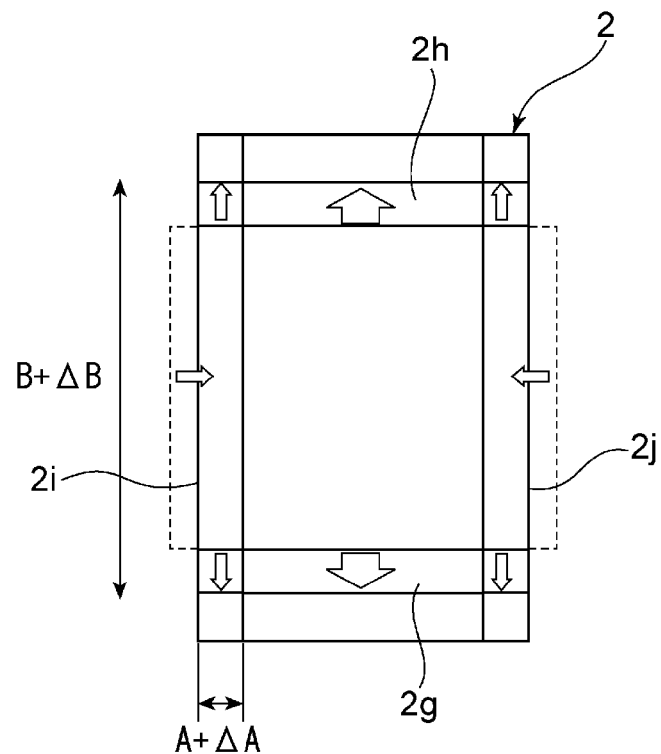
FIG. 4 is a schematic plan view of a monolithic ceramic capacitor for describing the mechanism in which distortion occurs in the monolithic ceramic capacitor.

FIG. 3 schematically shows a state prior to distortion. FIG. 4 schematically shows a state after the effective portion has been vertically stretched and distorted.

The inventors of the present application have discovered that, if it is assumed that the volumes of the first and second side portions 2i and 2j are constant before and after the distortion, the amount of contraction of each of the first and second side portions 2i and 2j is reduced in proportion to the dimension A of each of the first and second side portions 2i and 2j in the width direction. More specifically, the inventors of the present application have repeatedly conducted experiments and have discovered that, when the ratio of the dimension A of each of the first and second side portions 2i and 2j with respect to the dimension B of the effective portion preferably is about 0.04 or less, for example, the occurrence of acoustic noise is significantly reduced compared to when the ratio is greater than about 0.04.

In addition, the inventors of the present application have discovered that, when the ratio of the dimension A of the first and second side portions 2i and 2j with respect to the dimension B of the effective portion preferably is about 0.03 or less, the occurrence of acoustic noise is considerably reduced compared to when the ratio preferably is greater than about 0.03, for example. These discoveries have led to developments of preferred embodiments of the present invention.

Preferred embodiments of the present invention are described on the basis of the following non-limiting experimental examples. Using ceramic green sheets principally containing barium titanate, a ceramic body 2 was formed in accordance with the above-described method for producing the ceramic body 2. Ni was used as an inner electrode material.

When forming a first outer electrode 5 and a second outer electrode 6, plating films were stacked on thick-film electrodes. Cu was used for the thick films. Ni and Sn were used for the plating films. The number of stackings of first inner electrodes 3 and second inner electrodes 4 were adjusted, to form monolithic ceramic capacitors according to the first to fourth experimental examples indicated in Table 1 below. Table 1 shows a length $L_0$, a width $W_0$, and a thickness $T_0$ of the ceramic body 2.

Table 1 below indicates a dimension A of each of the first and second side portions and a dimension C in the stacking direction of a first outer layer portion 2g, which is nearer to a board than a second outer layer portion 2h when the monolithic ceramic capacitor is mounted on the board. Further, Table 1 also indicates the ratio A/B. Here, in each of the experimental examples, the monolithic ceramic capacitor was formed so that a dimension D in the stacking direction of a second outer layer section 2h was equal to the dimension C of the first outer layer section 2g.

TABLE 1

|  | Fourth Experimental Example | Third Experimental Example | Second Experimental Example | First Experimental Example |
| --- | --- | --- | --- | --- |
| Electrostatic Capacity (μF) | 22 | 15 | 22 | 10 |
| $L_0$ | 1.17 | 1.17 | 1.17 | 1.12 |
| $W_0$ | 0.677 | 0.620 | 0.680 | 0.627 |
| $T_0$ | 0.677 | 0.620 | 0.670 | 0.627 |

TABLE 1-continued

|     | Fourth Experimental Example | Third Experimental Example | Second Experimental Example | First Experimental Example |
|-----|---|---|---|---|
| A   | 0.017 | 0.017 | 0.024 | 0.051 |
| C   | 0.028 | 0.024 | 0.028 | 0.027 |
| A/B | 0.027 | 0.030 | 0.039 | 0.089 |

The dimensions indicated in Table 1 above were measured as follows. That is, the ceramic body of each monolithic ceramic capacitor was polished, to expose a cross section passing through the center of a chip and extending along the width direction W and a stacking direction T. Each exposed cross section was observed with a microscope, and measured in accordance with the following points:

(1) The dimension A of each first and second side portions in the width direction from an end portion of an inner electrode closest to the center of the ceramic body in the stacking direction was measured.

(2) The dimension B of an effective portion was obtained by measuring the distance between end portions of inner electrodes at respective two ends of the ceramic body in the thickness direction.

(3) The dimension C of the first outer layer portion 2g was obtained by measuring the distance to a bottom surface 2b of the ceramic body from a width-direction center of an inner electrode positioned at a bottom end of the ceramic body in the stacking direction.

(4) The dimension D of the second outer layer portion 2h was obtained by measuring the distance to a top surface 2a from a width-direction center of an inner electrode positioned at a top end of the ceramic body in the thickness direction.

The monolithic ceramic capacitors according to the first to fourth experimental examples prepared as described above were each mounted on a mount board using solder as a bonding material. The mount board had a thickness of about 1.6 mm and was a glass epoxy board in which glass fabric was added to a base material formed of epoxy resin. Samples of the first to fourth experimental examples were formed in this way.

Figure 7:
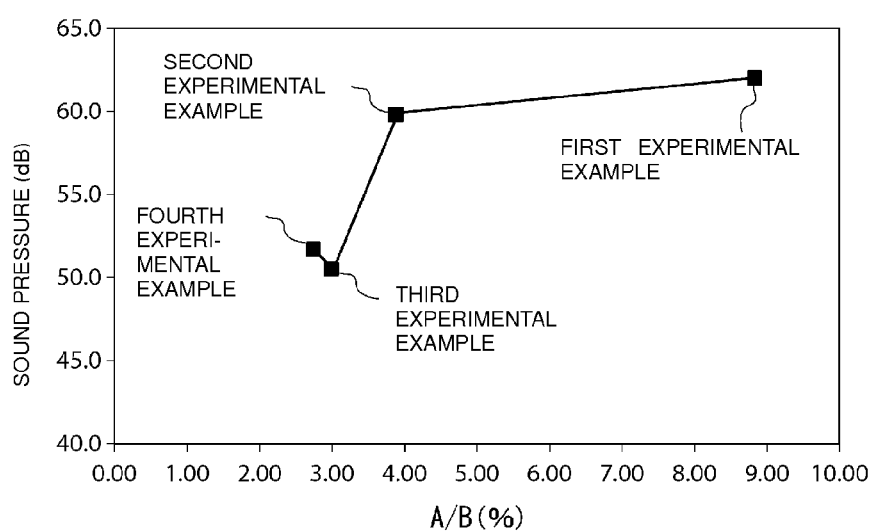
FIG. 7 is a graph showing a maximum sound pressure level in each of first to fourth experimental examples.

Each sample was set in an anechoic housing of a measuring device. An alternating voltage of about 1 Vpp in a frequency band of about 1 kHz to 6 kHz was applied to each monolithic ceramic capacitor in the anechoic housing. In this state, a sound collecting microphone, disposed about 3 mm above the monolithic ceramic capacitors, collected acoustic noise. Then, using a sound collector and an FFT analyzer (produced by Ono Sokki Co., Ltd.: CF-5220), the maximum sound pressure levels of the collected sounds were measured. The results are shown in FIG. 7. FIG. 7 clearly shows that the maximum sound pressure levels in the third and fourth experimental examples are considerably lower than those in the first and second experimental examples. Therefore, comparison of the first and second experimental examples with the third and fourth experimental examples shows that, when the ratio A/B is about 0.03 or less, for example, acoustic noise is drastically reduced.

As described above, in substantially rectangular parallelepiped monolithic ceramic capacitors whose maximum dimension among the external dimensions is less than about 1.88 mm, the wet height of the conductive bonding agent tends to vary. Therefore, variations in the reduction of such acoustic noise in monolithic ceramic capacitors tend to occur. Even in such monolithic ceramic capacitors, when A/B is about 0.04 or less, acoustic noise can be effectively reduced.

The first outer layer portion 2g, the second outer layer portion 2h, the first side portion 2i, and the second side portion 2j surround the effective portion when viewed from the length direction. Therefore, the distortion of the effective portion is restricted. In particular, the first outer layer portion 2g and the second outer layer portion 2h that sandwich the effective portion from respective two sides thereof restrict expansive strain of the effective portion.

Therefore, the thicker the first outer layer portion 2g and the second outer layer portion 2h, the higher the restricting force and the smaller the vertical displacement of the effective portion. In this case, the contraction of the first side portion 2i and the contraction of the second side portion 2j in the width direction W are reduced. As a result, it is possible to more effectively reduce acoustic noise. Therefore, as in the second, third, and fourth experimental examples, it is preferable that the dimension C of the first outer layer portion 2g or the dimension D of the second outer layer portion 2h be greater than the dimension A of each of the first side portion 2i and the second side portion 2j. That is, it is preferable that C>A or D>A, and more preferable that C>A and D>A. Further, as in the third and fourth experimental examples, it is preferable that C>A/0.7 or D>A/0.7 be satisfied. It is even more preferable that C>A/0.7 and D>A/0.7 be satisfied.

In the same way, when the dimension of the effective portion is B in the stacking direction, it is preferable that the dimension C of the first outer layer portion 2g be such that C/B is greater than about 0.07, for example. This makes it possible to further reduce acoustic noise. Alternatively, it is possible to reduce acoustic noise by increasing the dimension D of the second outer layer portion 2h in the stacking direction. Therefore, when D/B is preferably greater than about 0.07, for example, it is possible to more effectively reduce acoustic noise.

When the dimension D of the second outer layer portion 2h is too large, acoustic noise may not be sufficiently reduced. Therefore, in order to sufficiently reduce acoustic noise, it is preferable that $B/T_0>0.6$ and $1.2>C/D>0.8$ be satisfied. It is preferable that the dimension A of each of the first side portion 2i and the second side portion 2j be about 17 μm or less, for example, in which case, acoustic noise can be more effectively reduced.

It is preferable that the density of dielectric ceramic in each of the first and second side portions 2i and 2j be less than the density of dielectric ceramic in the dielectric layers of the effective portion. If the density of the dielectric ceramic in each of the first and second side portions 2i and 2j becomes less than the density of the dielectric ceramic in the dielectric layers of the effective portion, when the distortion propagates from the dielectric layers of the effective portion to the first and second side portions 2i and 2j, a portion of the energy of the distortion is scattered. Therefore, it is possible to effectively reduce the distortions of the first and second side portions 2i and 2j. Consequently, it is possible to more effectively reduce acoustic noise.

As mentioned above, in order to relatively reduce the density of dielectric ceramic in each of the first and second side portion 2i and 2j, a content ratio of glass in each of the first and second side portions 2i and 2j may be less than a content ratio of glass in the dielectric layers of the effective portion. In another method, a ratio of voids in each of the first and second side portions 2i and 2j may be less than a ratio of voids the dielectric layers of the effective portion. In order to reduce the ratio of voids, in a producing process, the amount of resin binder in ceramic green sheets or the amount of resin binder in a slurry for forming the side portions 2i and 2j may be set larger than the amount of resin binder in ceramic green sheets for the effective portion.

The density of dielectric ceramic is an area including dielectric ceramic per unit of area measured by Scanning Electron Microscope (SEM) and Wave-length Dispersive X-ray Spectrometry (WDX). The ratio of glass is glass content divided by Ti content per unit of area measured by Wave-length Dispersive X-ray Spectrometry (WDX) or Energy Dispersive X-ray Spectrometry (EDX). The ratio of voids is the number of voids per unit of area measured by Scanning Electron Microscope (SEM).

In the ceramic body 2, it is preferable that the ceramic serving as a principal component of the first and second side portions 2i and 2j be the same as the ceramic of the dielectric layers of the effective portion. This makes it possible to reduce the contraction ratio difference during firing. Moreover, the ceramic forming the first and second side portions 2i and 2j need not be of exactly the same composition as the ceramic of the dielectric ceramic of the effective portion. That is, they may be of different compositions.

Figure 6:
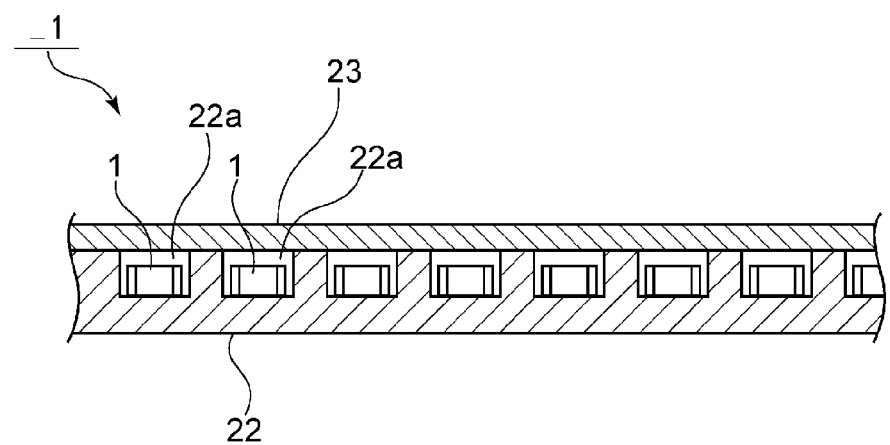
FIG. 6 is a partial cutaway front sectional view for describing a monolithic ceramic capacitor array according to a second preferred embodiment of the present invention.

FIG. 6 is a partial cutaway front sectional view for describing a monolithic ceramic capacitor array 21 according to a second preferred embodiment of the present invention. Monolithic ceramic capacitors 1 according to the first preferred embodiment may be supplied for being mounted on, for example, a circuit board using any method.

In order to reliably mount each of the monolithic ceramic capacitors 1 from a first outer layer section 2g, it is preferable to use the monolithic ceramic capacitor array 21 shown in FIG. 6. The monolithic ceramic capacitor array 21 includes a long carrier tape 22 and a long cover tape 23. The carrier tape 22 is provided with a plurality of cavities 22a that are open at one side. The plurality of cavities 22a are preferably disposed in a length direction of the carrier tape 22.

The monolithic ceramic capacitors 1 are accommodated in the respective cavities 22a. More specifically, the monolithic ceramic capacitors 1 are disposed so that the inner electrodes 3 and 4 shown in FIG. 1 are parallel or substantially parallel to the bottom surfaces of the cavities 22a. The first outer layer portion 2g of each monolithic ceramic capacitor 1 is accommodated so as to be positioned at the bottom surface, that is, the lower side of the cavities 22a.

The cover tape 23 is bonded to one side of the carrier tape 22 so as to close the plurality of cavities 22a.

In the monolithic ceramic capacitor array 21, the monolithic ceramic capacitors 1 are accommodated in the cavities 22a as mentioned above. Therefore, in mounting the monolithic ceramic capacitors 1, after removing the cover tape 23, the monolithic ceramic capacitors 1 are picked up and held from the top surfaces of the monolithic ceramic capacitors 1. Consequently, it is possible to reliably mount the monolithic ceramic capacitors 1 on, for example, a circuit board from the respective first outer layer portions 2g by removing the monolithic ceramic capacitors 1 from the respective recessed portions 22a using, for example, a suction head.

When the monolithic ceramic capacitors 1 have been mounted on the circuit board from the respective first outer layer portions 2g, it is preferable that the dimension C of each first outer layer portion 2g be greater than the dimension D of each second outer layer portion 2h. That is, it is preferable that C>D be satisfied. This is because, as discussed in Japanese Unexamined Patent Application Publication No. 2013-65820, the thickness of the outer layer portion near the circuit board is effective in reducing acoustic noise, and the acoustic noise is reduced while the height of each monolithic ceramic capacitor as a whole is reduced.

In addition, the expansive strain of each effective portion is restricted by increasing the dimension C of its corresponding first outer layer portion 2g. Therefore, contraction of the first side portion 2i in the width direction W and contraction of the second side gap portion 2j in the width direction W are reduced. Consequently, it is more preferable that the condition C>D>A be satisfied in addition to the condition C>D. This makes it possible to further reduce acoustic noise.

According to various preferred embodiments of the present invention, as mentioned above, it is possible to effectively reduce acoustic noise. Therefore, the present invention is particularly effective for monolithic ceramic capacitors in which acoustic noise tends to occur, such as monolithic ceramic capacitors having a high capacitance, monolithic ceramic capacitors using dielectric materials having a high relative dielectric constant, monolithic ceramic capacitors including a large number of stackings of inner electrodes, and monolithic ceramic capacitors including thin dielectric layers interposed between adjacent ones of the inner electrodes. More specifically, acoustic noise tends to occur even in monolithic ceramic capacitors whose capacitance is about 1 µF or higher, in particular, about 10 µF or higher. Various preferred embodiments of the present invention are also effective even for such monolithic ceramic capacitors. Various preferred embodiments of the present invention are also effective for monolithic ceramic capacitors using dielectric materials having a relative dielectric constant that is about 3000 or higher. Further, various preferred embodiments of the present invention effective for monolithic ceramic capacitors in which the number of stackings of inner electrodes is about 350 or more. Still further, various preferred embodiments of the present invention are effective for monolithic ceramic capacitors in which dielectric layers interposed between adjacent first and second inner electrodes have a thickness of about 1 µm or smaller.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A monolithic ceramic capacitor comprising:
    a ceramic body including dielectric layers; and
    a plurality of inner electrodes stacked so as to oppose each other via one of the dielectric layers interposed therebetween: wherein
    a direction in which the plurality of inner electrodes are stacked is a stacking direction, a direction that is perpendicular or substantially perpendicular to the stacking direction is a length direction, and a direction that is perpendicular or substantially perpendicular to the stacking direction and to the first direction is a width direction;
    the ceramic body includes an effective portion including the plurality of the inner electrodes, a first outer layer portion and a second outer layer portion sandwiching the effective portion in the stacking direction, and a first side portion, and a second side portion sandwiching the effective portion in the width direction; and
    A/B is about 0.04 or less when a dimension of each of the first side portion and the second side portion in the width direction is A and a dimension of the effective portion in the stacking direction is B.

2. The monolithic ceramic capacitor according to claim 1, wherein
an outer surface of the first outer layer portion that is perpendicular or substantially perpendicular to the stacking direction is a mounting surface; and
when a dimension of the first outer layer portion in the stacking direction is C, C>A is satisfied.

3. The monolithic ceramic capacitor according to claim 1, wherein
an outer surface of the first outer layer portion that is perpendicular or substantially perpendicular to the stacking direction is a mounting surface; and
when a dimension of the first outer layer portion is C and a dimension of the second outer layer portion is D, C>D is satisfied.

4. The monolithic ceramic capacitor according to claim 1, wherein
an outer surface of the first outer layer portion that is perpendicular or substantially perpendicular to the stacking direction is a mounting surface; and
when a dimension of the first outer layer portion is C in the stacking direction and a dimension of the second outer layer portion in the stacking direction is D, C>D>A is satisfied.

5. The monolithic ceramic capacitor according to claim 1, wherein the dimension A is about 17 μm or less.

6. The monolithic ceramic capacitor according to claim 1, wherein a density of dielectric ceramic in each of the first side portion and the second side portion is less than a density of dielectric ceramic in one of the dielectric layers of the effective portion.

7. The monolithic ceramic capacitor according to claim 1, wherein
the ceramic body contains dielectric ceramic and glass; and
a content ratio of glass in each of the first side portion and the second side portion is less than a content ratio of glass in one of the dielectric layers of the effective portion.

8. The monolithic ceramic capacitor according to claim 1, wherein
the ceramic body includes voids; and
a ratio of voids in each of the first side portion and the second side portion is less than a ratio of the voids in one of the dielectric layers of the effective portion.

9. The monolithic ceramic capacitor according to claim 1, wherein A/B is about 0.03 or less.

10. A monolithic ceramic capacitor array comprising:
a carrier tape including a plurality of cavities; and
a plurality of the monolithic ceramic capacitors according to claim 1 that are accommodated in the respective cavities; wherein
the inner electrodes of each monolithic ceramic capacitor are parallel or substantially parallel to a bottom surface of the corresponding cavity.

11. A monolithic ceramic capacitor mounting structure comprising:
a board; and
the monolithic ceramic capacitor according to claim 1 that is mounted on a surface of the board; wherein
the stacking direction is perpendicular or substantially perpendicular to the surface of the board, and the first outer layer portion is positioned closer to the board than the second outer layer portion.

12. The monolithic ceramic capacitor mounting structure according to claim 11, wherein
an outer surface of the first outer layer portion that is perpendicular or substantially perpendicular to the stacking direction is a mounting surface; and
when a dimension of the first outer layer portion is C, C>A is satisfied.

13. The monolithic ceramic capacitor mounting structure according to claim 11, wherein
an outer surface of the first outer layer portion that is perpendicular or substantially perpendicular to the stacking direction is a mounting surface; and
when a dimension of the first outer layer portion is C in the stacking direction and a dimension of the second outer layer portion in the stacking direction is D, C>D is satisfied.

14. The monolithic ceramic capacitor mounting structure according to claim 11, wherein
an outer surface of the first outer layer portion that is perpendicular or substantially perpendicular to the stacking direction is a mounting surface; and
when a dimension of the first outer layer portion in the stacking direction is C and a dimension of the second outer layer portion in the stacking direction is D, C>D>A is satisfied.

15. The monolithic ceramic capacitor mounting structure according to claim 11, wherein the dimension A is about 17 μm or less.

16. The monolithic ceramic capacitor mounting structure according to claim 11, wherein a density of dielectric ceramic in each of the first side portion and the second side portion is less than a density of dielectric ceramic in one of the dielectric layers of the effective portion.

17. The monolithic ceramic capacitor mounting structure according to claim 11, wherein
the ceramic body contains dielectric ceramic and glass; and
a content ratio of glass in each of the first side portion and the second side portion is less than a content ratio of glass in one of the dielectric layers of the effective portion.

18. The monolithic ceramic capacitor mounting structure according to claim 11, wherein
the ceramic body includes voids; and
a ratio of the voids in each of the first side portion and the second side portion is less than a ratio of the voids in one of the dielectric layers of the effective portion.

19. The monolithic ceramic capacitor mounting structure according to claim 11, wherein A/B is about 0.03 or less.

* * * * *